US012620557B2

(12) United States Patent
Yamagishi et al.

(10) Patent No.: US 12,620,557 B2
(45) Date of Patent: May 5, 2026

(54) PLASMA PROCESSING APPARATUS

(71) Applicant: Tokyo Electron Limited, Tokyo (JP)

(72) Inventors: Syouji Yamagishi, Nirasaki (JP);
Hiroki Ehara, Nirasaki (JP); Hiroyuki Hayashi, Nirasaki (JP); Jun Nakagomi, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 345 days.

(21) Appl. No.: 17/804,379

(22) Filed: May 27, 2022

(65) Prior Publication Data

US 2022/0384146 A1     Dec. 1, 2022

(30) Foreign Application Priority Data

May 31, 2021     (JP) ................................. 2021-091799

(51) Int. Cl.
H01J 37/32          (2006.01)
(52) U.S. Cl.
CPC ..... H01J 37/3244 (2013.01); H01J 2237/327 (2013.01)
(58) Field of Classification Search
None
See application file for complete search history.

(56) References Cited

U.S. PATENT DOCUMENTS 6,013,155 A *   1/2000   McMillin .............. C23C 16/507
                                                        216/68
9,767,993 B2 *  9/2017   Ishibashi ........... H01J 37/32495

2007/0163996 A1 *  7/2007  Horiguchi ......... H01J 37/32192
                                                           156/345.38
2009/0229753 A1 *  9/2009  Ohmi ................ C23C 16/45568
                                                           264/642
2009/0230636 A1 *  9/2009  Goto ................... H01L 21/6831
                                                           279/128
2010/0178775 A1 *  7/2010  Okesaku ............. H01J 37/3255
                                                           438/726
2014/0262034 A1 *  9/2014  Ishibashi ........... C23C 16/45563
                                                           118/723 AN
2021/0110999 A1 *  4/2021  Ikeda .................. H01J 37/3244

FOREIGN PATENT DOCUMENTS

| JP | 2014-183297 A | 9/2014 |
|----|---------------|--------|
| JP | 2021-064508 A | 4/2021 |
| KR | 10-2014-0084018 A | 7/2014 |
| KR | 10-2018-0045819 A | 5/2018 |

* cited by examiner

*Primary Examiner* — Jeffrie R Lund
*Assistant Examiner* — Tiffany Z Nuckols
(74) *Attorney, Agent, or Firm* — Armstrong Teasdale LLP

(57)          ABSTRACT

A plasma processing apparatus includes a process container, a power supply configured to supply radio frequency or microwave power for generating plasma in the process container, a plurality of gas nozzles, each having a gas flow passage therein, and a plurality of protrusions formed integrally with a ceiling wall and/or a sidewall that defines the process container, the plurality of protrusions protruding from the ceiling wall and/or the sidewall. Each of the plurality of protrusions has a gas hole at a leading end of the protrusion. The ceiling wall and/or the sidewall has recesses in which the plurality of gas nozzles is arranged, respectively, such that the gas flow passage of each of the plurality of gas nozzles communicates with the gas hole of each of the plurality of protrusions.

11 Claims, 9 Drawing Sheets

FIG. 1

Gas        Gas 15b   18   19      19   18   15a

FIG. 8C
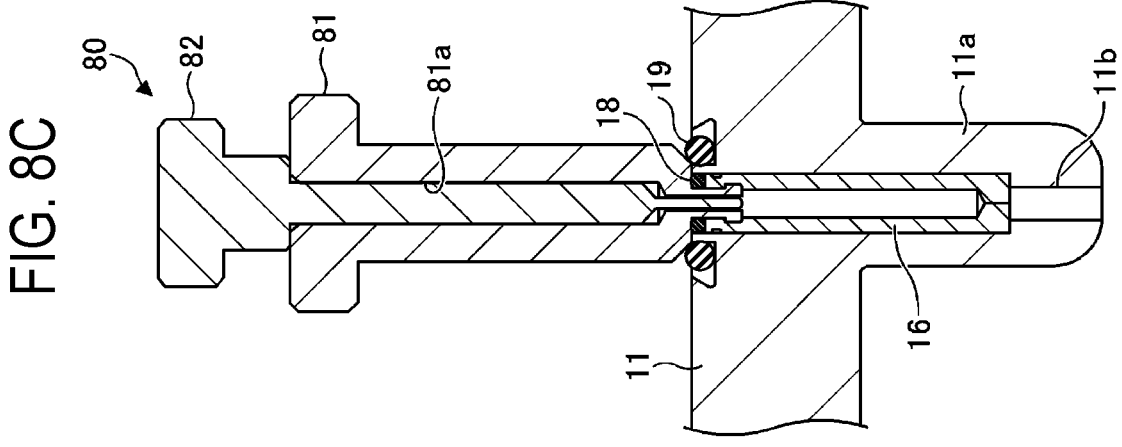
FIG. 8B
FIG. 8A
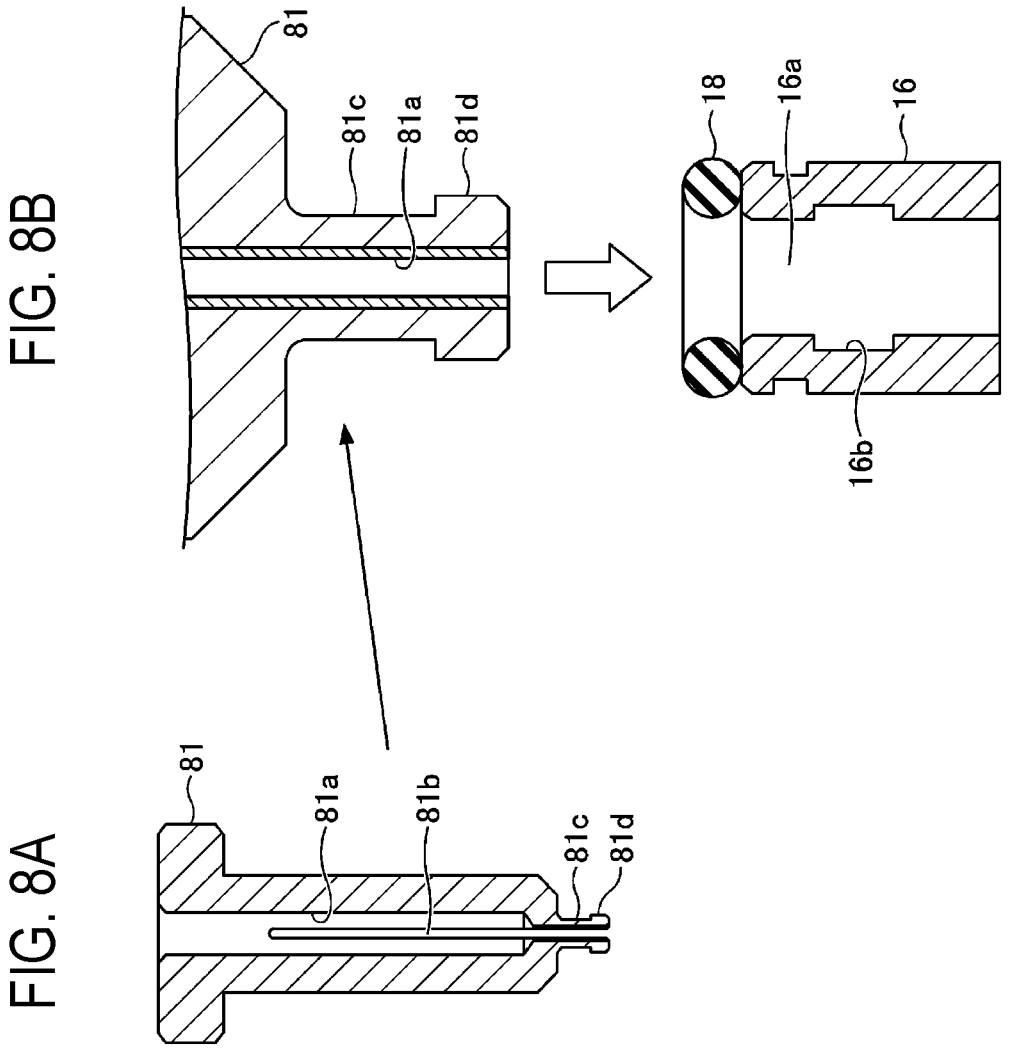

PLASMA PROCESSING APPARATUS

CROSS-REFERENCE TO RELATED APPLICATION

This application is based upon and claims the benefit of priority from Japanese Patent Application No. 2021-091799, filed on May 31, 2021, the entire contents of which are incorporated herein by reference.

TECHNICAL FIELD

The present disclosure relates to a plasma processing apparatus.

BACKGROUND

For example, Patent Document 1 discloses a plasma processing apparatus which generates surface wave plasma by microwaves. The disclosed plasma processing apparatus includes a shower plate for supplying a first gas and a second gas into a process container. The shower plate is formed with a plurality of gas holes for supplying the first gas into the process container and a plurality of supply nozzles which protrude vertically downward from the lower surface of the shower plate at positions different from the plurality of gas holes and supply the second gas into the process container.

As another example, Patent Document 2 discloses a plasma processing apparatus including a process container and a plurality of gas nozzles which protrude from a ceiling wall and/or a sidewall constituting the process container and have gas supply holes for supplying a gas into the process container. The plurality of gas nozzles have a diameter expansion portion which expands from the fine holes of the gas supply holes at the leading ends of the gas supply holes of the plurality of gas nozzles so as to open into a process space.

PRIOR ART DOCUMENT

Patent Documents

Japanese laid-open publication No. 2014-183297
Japanese laid-open publication No. 2021-064508

SUMMARY

According to one embodiment of the present disclosure, there is provided a plasma processing apparatus includes a process container, a power supply configured to supply radio frequency or microwave power for generating plasma in the process container, a plurality of gas nozzles, each having a gas flow passage therein, and a plurality of protrusions formed integrally with a ceiling wall and/or a sidewall that defines the process container, the plurality of protrusions protruding from the ceiling wall and/or the sidewall. Each of the plurality of protrusions has a gas hole at a leading end of the protrusion. The ceiling wall and/or the sidewall has recesses in which the plurality of gas nozzles is arranged, respectively, such that the gas flow passage of each of the plurality of gas nozzles communicates with the gas hole of each of the plurality of protrusions.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 1 is a schematic cross-sectional view showing an example of a plasma processing apparatus according to an embodiment.

FIG. 7 is a view for explaining installation of a gas nozzle according to an embodiment.

FIGS. 8A to 8C are views for explaining a taking-out jig and taking-out method of the gas nozzle according to an embodiment.

DETAILED DESCRIPTION

Figure 2:
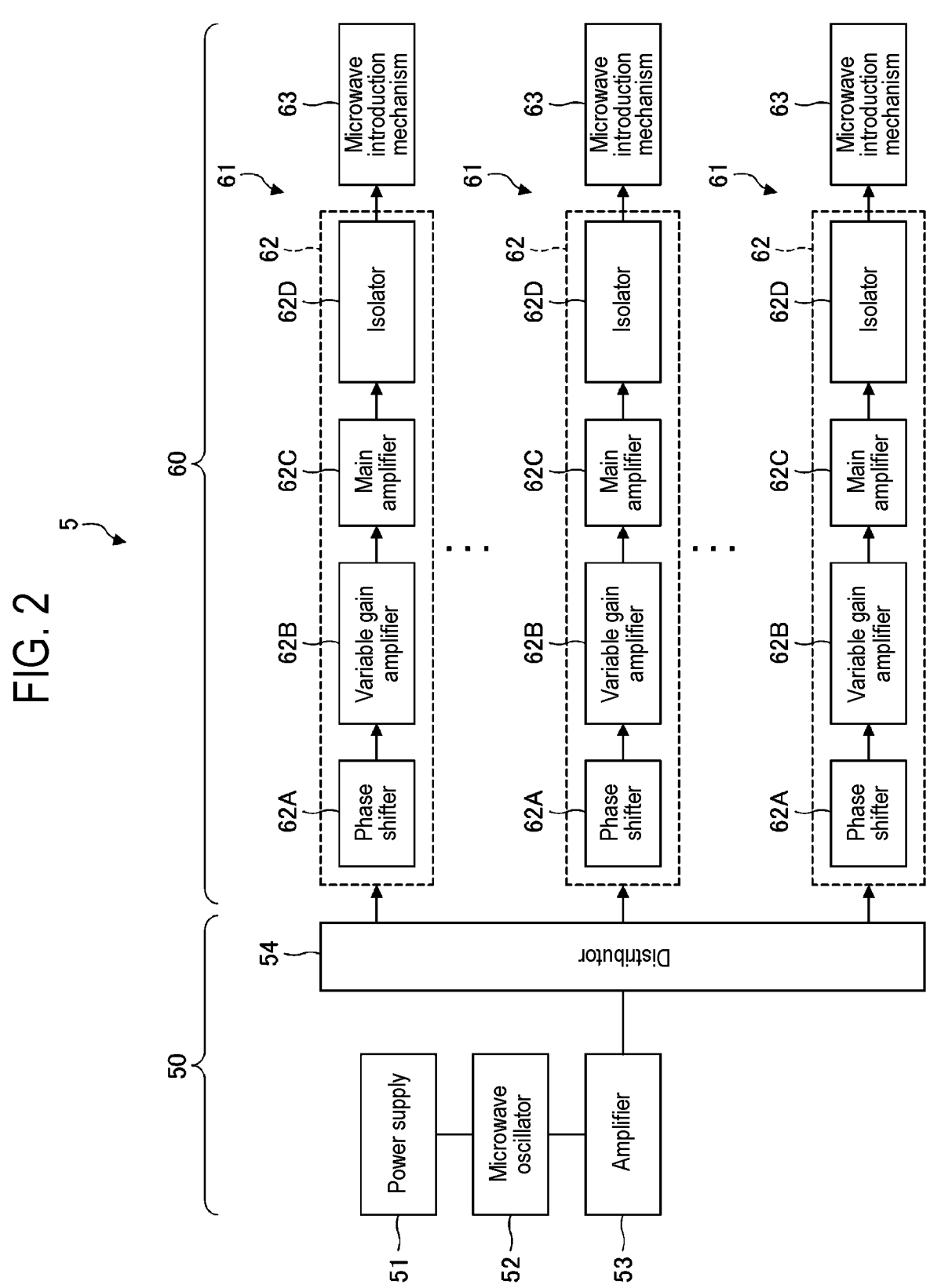
FIG. 2 is a diagram showing the configuration of a microwave introduction module according to an embodiment.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, an embodiment for carrying out the present disclosure will be described with reference to the drawings. Throughout the drawings, the same components may be denoted by the same reference numerals, and explanation thereof may not be repeated.

[Plasma Processing Apparatus]

Figure 1:
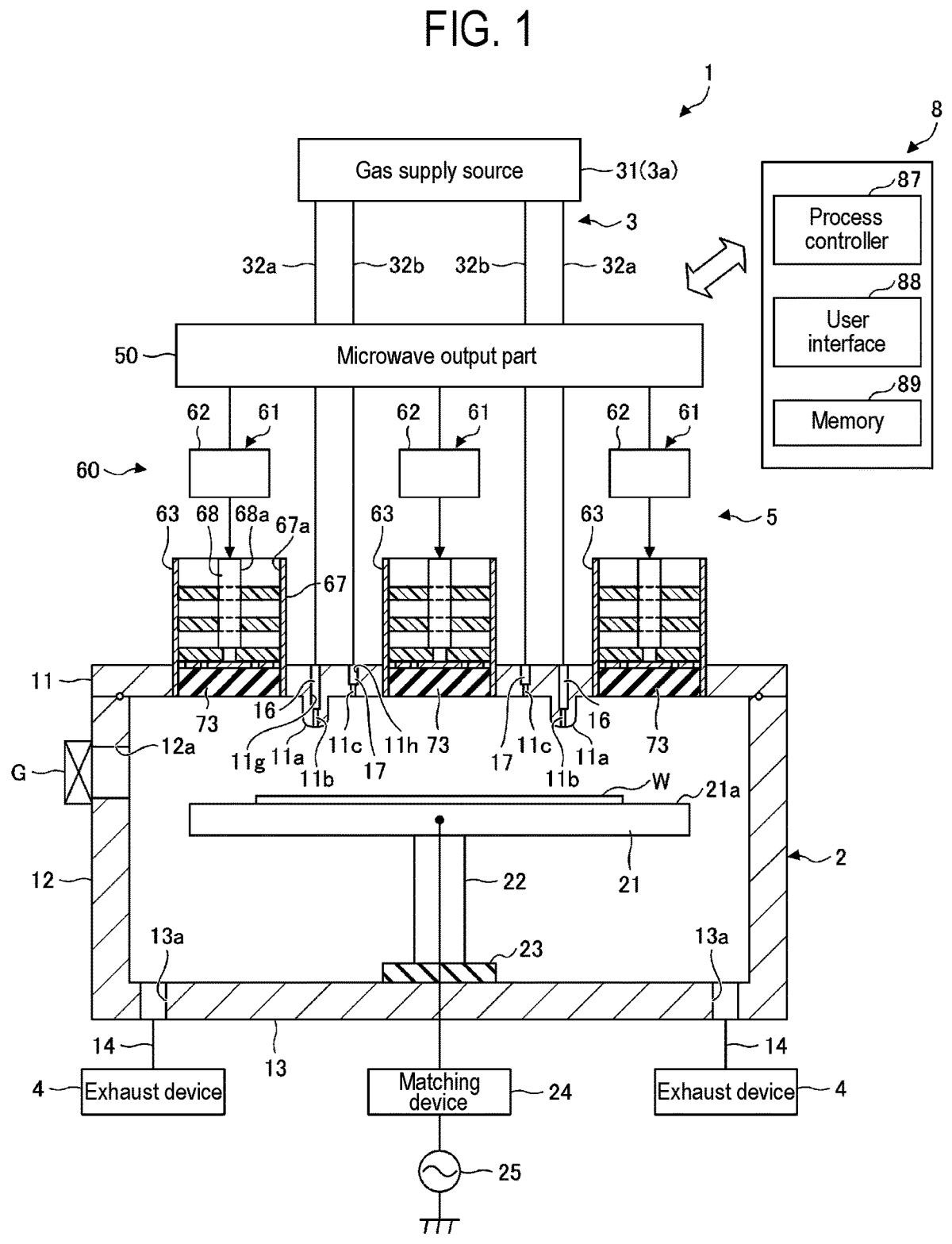

An example of the configuration of a plasma processing apparatus 1 according to an embodiment will be described with reference to FIG. 1. FIG. 1 is a schematic cross-sectional view showing an example of the plasma processing apparatus 1 according to the embodiment. The plasma processing apparatus 1 according to the embodiment is an apparatus which performs predetermined processes such as a film forming process, a diffusion process, an etching process, and an ashing process on a substrate W, for example, a semiconductor wafer as an example.

The plasma processing apparatus 1 has a process container 2, a stage 21, a gas supply mechanism 3, an exhaust device 4, a microwave introduction module 5, and a control device 8. The process container 2 accommodates the substrate W, which is the object to be processed. The stage 21 is arranged inside the process container 2 and has a placement surface 21*a* on which the substrate W is placed. The gas supply mechanism 3 supplies a gas into the process container 2. The exhaust device 4 depressurizes and exhausts the interior of the process container 2. The microwave introduction module 5 introduces a microwave for generating plasma in the process container 2. The control device 8 controls each part of the plasma processing apparatus 1.

The process container 2 has, for example, substantially a cylindrical shape. The process container 2 is made of a metal material such as aluminum and an alloy thereof. The microwave introduction module 5 is arranged in an upper portion of the process container 2 and functions as a plasma generation part which introduces radio frequency or a microwave (microwave in the present embodiment) into the process container 2 to generate plasma.

The process container 2 has a plate-shaped ceiling wall 11, a bottom wall 13, and a sidewall 12 connecting the ceiling wall 11 and the bottom wall 13. The ceiling wall 11, the sidewall 12, and the bottom wall 13 are formed of a conductive member such as aluminum. The ceiling wall 11 and/or the sidewall 12 has a plurality of protrusions 11a which is formed integrally with the ceiling wall 11 and/or the sidewall 12 defining the process container 2, and protrudes from the ceiling wall 11 and/or the sidewall 12. In the present disclosure, the ceiling wall 11 has a plurality of protrusions 11a, each of which is arranged in a recess 11g. For example, twelve protrusions 11a are evenly arranged in the circumferential direction. However, the number and arrangement of protrusions 11a are not limited thereto. A gas hole 11b is provided at a leading end of each of the plurality of protrusions 11a. The ceiling wall 11 and/or the sidewall 12 has a recess 11g in which each of a plurality of gas nozzles 16 is arranged. Each of the plurality of gas nozzles 16 has a gas flow passage 16a therein (see FIG. 4). Each of the plurality of gas nozzles 16 is a cartridge-type gas supply part installed in the recess 11g so that the gas flow passage 16a communicates with each of the plurality of gas holes 11b of the plurality of protrusions 11a.

An inner peripheral side of the plurality of protrusions 11a has a plurality of gas holes 11c formed in the ceiling wall 11 and/or the sidewall 12. For example, twelve gas holes 11c are formed evenly in the circumferential direction. However, the number and arrangement of gas holes 11c are not limited thereto.

The ceiling wall 11 and/or the sidewall 12 has recesses 11h in which the plurality of gas nozzles 17 is arranged, respectively. In the present disclosure, the ceiling wall 11 has the recesses 11h in which the plurality of gas nozzles 17 is arranged, respectively. Each of the plurality of gas nozzles 17 has a gas flow passage 17a therein (see FIG. 4). Each of the plurality of gas nozzles 17 is a cartridge-type gas supply part installed in the recess 11h so that the gas flow passage 17a communicates with each of the plurality of gas holes 11c.

The plurality of protrusions 11a protrudes downward from the ceiling wall 11 toward the stage 21, but the present disclosure is not limited thereto. For example, the plurality of protrusions 11a may be formed integrally with the sidewall 12 to protrude from the sidewall 12 toward the inside of the process container 2, or may protrude from both the ceiling wall 11 and the sidewall 12. Further, in the present disclosure, the plurality of gas holes 11c is opened downward from the ceiling wall 11, but the present disclosure is not limited thereto. For example, the plurality of gas holes 11c may be opened from the sidewall wall 12 toward the inside of the process container 2, or may be provided on both the ceiling wall 11 and the sidewall 12. As a result, a gas can be supplied downward or laterally from at least one of the ceiling wall 11 and/or the sidewall 12.

The gas supply mechanism 3 has a gas supply device 3a including a gas supply source 31, a pipe 32a connecting the gas supply source 31 and the plurality of gas nozzles 16, and a pipe 32b connecting the gas supply source 31 and the plurality of gas nozzles 17. Although one gas supply source 31 is shown in FIG. 1, the gas supply device 3a may include a plurality of gas supply sources depending on the type of gas used.

The gas supply device 3a further includes a mass flow controller (not shown) and an opening/closing valve (not shown) provided in the middle of the pipes 32a and 32b. The types, flow rates, and the like of gases supplied into the process container 2 are controlled by the mass flow controller and the opening/closing valve.

The gas supply source 31 is used as a gas supply source for, for example, a rare gas for plasma generation, gases used for an oxidation process, a nitridation process, a film forming process, an etching process, and an ashing process, and the like. For example, a gas which is hardly decomposed may be introduced from the plurality of gas nozzles 17, and a gas which is easily decomposed may be introduced from the plurality of gas nozzles 16. For example, of a $N_2$ gas and a silane gas, which are used for forming a SiN film, the $N_2$ gas which is hardly decomposed may be introduced from the plurality of gas nozzles 17, and the silane gas which is easily decomposed may be introduced from the plurality of gas nozzles 16.

The sidewall 12 has a loading/unloading port 12a for loading/unloading the substrate W into/from a transfer chamber (not shown) adjacent to the process container 2. A gate valve G is arranged between the process container 2 and the transfer chamber (not shown). The gate valve G has a function of opening/closing the loading/unloading port 12a. The gate valve G hermetically seals the process container 2 in a closed state and enables the transfer of the substrate W between the process container 2 and the transfer chamber (not shown) in an opened state.

The bottom wall 13 has a plurality of (two in FIG. 1) exhaust ports 13a. The plasma processing apparatus 1 further has exhaust pipes 14 connecting the exhaust ports 13a and the exhaust device 4. The exhaust device 4 has an APC valve and a high-speed vacuum pump capable of rapidly depressurizing the internal space of the process container 2 to a predetermined degree of vacuum. Examples of such a high-speed vacuum pump may include a turbo molecular pump and the like. By operating the high-speed vacuum pump of the exhaust device 4, the internal space of the process container 2 is depressurized to the predetermined vacuum degree, for example, 0.133 Pa.

The plasma processing apparatus 1 further has a support member 22 which supports the stage 21 in the process container 2, and an insulating member 23 provided between the support member 22 and the bottom wall 13. The stage 21 is for placing the substrate W horizontally. The support member 22 has substantially a cylindrical shape extending from the center of the bottom wall 13 toward the internal space of the process container 2. The stage 21 and the support member 22 are made of, for example, aluminum or the like whose surface is subjected to alumite treatment (anodic oxidation treatment).

The plasma processing apparatus 1 has a radio frequency bias power supply 25 which supplies radio frequency power to the stage 21, and a matching device 24 provided between the stage 21 and the radio frequency bias power supply 25. The radio frequency bias power supply 25 supplies the radio frequency power to the stage 21 in order to draw ions into the substrate W. The matching device 24 has a circuit for matching the output impedance of the radio frequency bias power supply 25 with the impedance on the load side (the stage 21 side).

The plasma processing apparatus 1 may further have a temperature control mechanism (not shown) for heating or cooling the stage 21. The temperature control mechanism controls, for example, the temperature of the substrate W in a range of 25 degrees C. (room temperature) to 900 degrees C.

The various components of the plasma processing apparatus 1 are connected to and controlled by the control device 8. The control device 8 is typically a computer. In the example shown in FIG. 1, the control device 8 has a process controller 87 including a CPU, a user interface 88 connected to the process controller 87, and a memory 89.

The process controller 87 controls each component related to the process conditions such as temperature, pressure, gas flow rate, radio frequency power for applying bias force, and microwave output in the plasma processing apparatus 1. For example, the process controller 87 controls the radio frequency bias power supply 25, the gas supply device 3a, the exhaust device 4, and the microwave introduction module 5.

The user interface 88 has a keyboard and a touch panel for an administrator to input commands for managing the plasma processing apparatus 1, a display for visualizing and displaying the operating status of the plasma processing apparatus 1, and the like.

The memory 89 stores control programs for realizing various processes executed by the plasma processing apparatus 1 under the control of the process controller 87, recipes in which process condition data and the like are recorded, and the like. The process controller 87 calls and executes an arbitrary control program or recipe, such as an instruction from the user interface 88, from the memory 89 as necessary. As a result, a desired process is performed in the process container 2 of the plasma processing apparatus 1 under the control of the process controller 87.

The above control programs and recipes can be used, for example, in a state of being stored in a non-transitory computer-readable storage medium such as a flash memory, a DVD, or a Blu-ray disc. Further, the above recipes can be transmitted and used online at any time from other apparatuses, for example, via a dedicated line.

Next, an example of the configuration of the microwave introduction module will be described with reference to FIGS. 1 and 2. As shown in FIG. 1, the microwave introduction module 5 is provided in an upper portion of the ceiling wall 11 and introduces a microwave into the process container 2. The microwave introduction module 5 has a microwave output part 50 and an antenna unit 60. The microwave output part 50 generates the microwave and distributes and outputs the microwave to a plurality of paths. The antenna unit 60 introduces the microwave, which is output from the microwave output part 50, into the process container 2. The microwave output part 50 is an example of a power supply which supplies radio frequency or microwave power for generating plasma in the process container 2. Although the microwave is output in the present disclosure, radio frequency power in a band including a VHF band or an UHF band instead of the microwave band may be supplied.

As shown in FIG. 2, the microwave output part 50 includes a power supply 51, a microwave oscillator 52, an amplifier 53 which amplifies a microwave oscillated by the microwave oscillator 52, and a distributor 54 which distributes the microwave amplified by the amplifier 53 to a plurality of paths. The microwave oscillator 52 oscillates the microwave at a predetermined frequency (for example, 2.45 GHz). The frequency of the microwave is not limited to 2.45 GHz, but may be 8.35 GHz, 5.8 GHz, 1.98 GHz, or the like. Further, such a microwave output part 50 can also be applied when the frequency of the microwave is within a range of 800 MHz to 1 GHz, for example, 860 MHz. The distributor 54 distributes the microwave while matching the impedances on the input side and the output side.

The antenna unit 60 includes a plurality of antenna modules 61. Each of the plurality of antenna modules 61 introduces the microwave distributed by the distributor 54 into the process container 2. In the present embodiment, the configurations of the plurality of antenna modules 61 are all the same. Each antenna module 61 has an amplifier part 62 which mainly amplifies and outputs the distributed microwave, and a microwave introduction mechanism 63 which introduces the microwave, which is output from the amplifier part 62, into the process container 2.

The amplifier part 62 has a phase shifter 62A, a variable gain amplifier 62B, a main amplifier 62C, and an isolator 62D. The phase shifter 62A changes the phase of the microwave. The variable gain amplifier 62B adjusts the power level of the microwave input to the main amplifier 62C. The main amplifier 62C is configured as a solid state amplifier. The isolator 62D separates a reflected microwave reflected by an antenna portion of the microwave introduction mechanism 63 and directed toward the main amplifier 62C.

The phase shifter 62A changes the phase of the microwave to change the radiation characteristics of the microwave. The phase shifter 62A is used to control the directivity of the microwave to change the distribution of plasma by, for example, adjusting the phase of the microwave for each antenna module 61. If such adjustment of radiation characteristics is not performed, the phase shifter 62A may not be provided.

The variable gain amplifier 62B is used for adjusting the variation of each antenna module 61 and adjusting the plasma intensity. For example, by changing the variable gain amplifier 62B for each antenna module 61, the distribution of plasma in the entire process container 2 can be adjusted.

The main amplifier 62C includes, for example, an input matching circuit, a semiconductor amplification element, an output matching circuit, and a high Q resonance circuit (not shown). As the semiconductor amplification element, for example, GaAsHEMT, GaNHEMT, or LD (Laterally Diffused)-MOS capable of class E operation are used.

The isolator 62D has a circulator and a dummy load (coaxial terminator). The circulator guides the microwave reflected by the antenna portion of the microwave introduction mechanism 63 to the dummy load. The dummy load converts the reflected microwaves guided by the circulator into heat. As described above, in the present embodiment, the plurality of antenna modules 61 is provided, and a plurality of microwaves introduced into the process container 2 by the microwave introduction mechanisms 63 of the plurality of antenna modules 61 is synthesized in the process container 2. Therefore, the individual isolator 62D may be small and can be provided adjacent to the main amplifier 62C.

As shown in FIG. 1, the plurality of microwave introduction mechanisms 63 is installed in the ceiling wall 11. A space between an inner side surface 67a of a main body container 67 constituting the microwave introduction mechanism 63 and an outer side surface 68a of an inner conductor 68 forms a microwave transmission path. The microwave that has passed through the microwave transmission path transmits through the dielectric 73 via a slot and is supplied into the process container 2.

[Gas Supply Structure]

As shown in FIG. 1, the plasma processing apparatus 1 has the plurality of gas nozzles 16 and the plurality of gas nozzles 17 on the ceiling wall 11. However, the plasma processing apparatus 1 may have either the plurality of gas nozzles 16 or the plurality of gas nozzles 17 on the ceiling wall 11 and/or the sidewall 12.

Figure 3:
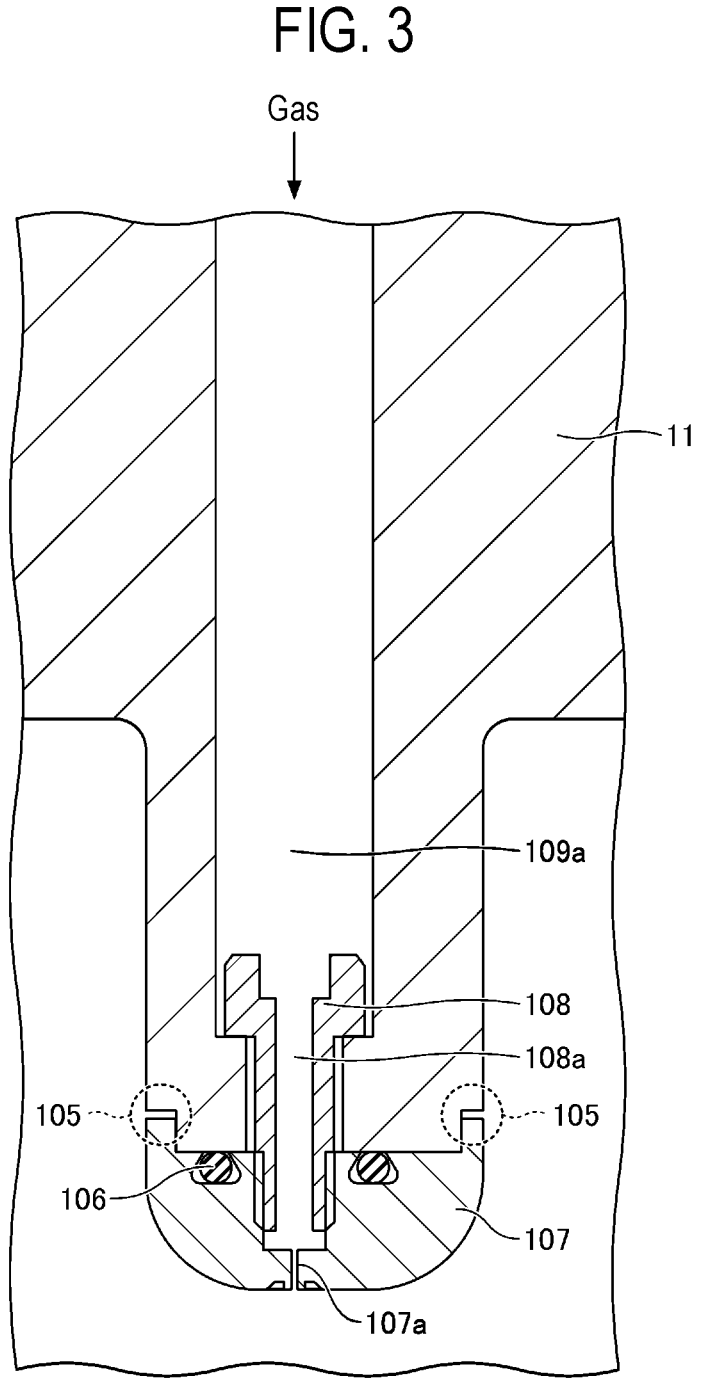
FIG. 3 is a view showing an example of a gas nozzle according to a reference example.

Next, an example of the configuration of a gas nozzle according to a reference example shown in FIG. 3 will be described, and then an example of a gas supply structure having the gas nozzle 16 and the gas nozzle 17 according to the present embodiment shown in FIG. 4 will be described.

In the reference example, a gas flow passage 109a is formed inside each of a plurality of protrusions formed integrally with the ceiling wall 11 and protruding from the ceiling wall 11. Further, at the leading end of the gas flow passage 109a, a leading end nozzle 107 is fixed to the leading end of the protrusion integrated with the ceiling wall 11 by a bolt 108. The leading end nozzle 107 is made of aluminum. As a result, the gas flow passage 109a and a gas hole 107a provided in the leading end nozzle 107 communicate with each other through a hole 108a of the bolt 108. The gas hole 107a of the leading end nozzle 107 has a diameter of about 1 mm and is thin. Therefore, the gas hole 107a is likely to be clogged when a gas is supplied into the process container 2 from the gas flow passage 109a. Therefore, the leading end nozzle 107 is configured to be easily replaced with a new one in order to cope with the clogging of the gas hole 107a.

An O-ring 106 is provided between the lower surface of the protrusion and the upper surface of the leading end nozzle 107. The O-ring 106 is provided to prevent a gas supplied into the process container 2 from the gas hole 107a through the hole 108a of the bolt 108 and the gas flow passage 109a from leaking through a gap between the lower surface of the protrusion and the upper surface of the leading end nozzle 107 to the outer peripheral side.

A microwave propagates on the surfaces of the ceiling wall 11 including the protrusion and the leading end nozzle 107 and the surfaces are exposed to plasma. Therefore, the surfaces of the ceiling wall 11 including the protrusion and the leading end nozzle 107 are coated with a yttria ($Y_2O_3$) film so as not to be easily affected by the plasma. When the microwave propagates through a gap of an adjoining portion 105 between the protrusion of the ceiling wall 11 and the leading end nozzle 107, an abnormal discharge may occur due to the concentration of a microwave electric field in the gap of the adjoining portion 105. When the abnormal discharge occurs, the yttrium film (sprayed film) near the adjoining portion 105 is peeled off and becomes particles, which affects a film forming process of the substrate W.

Therefore, the plasma processing apparatus 1 according to the embodiment has a gas supply structure for avoiding abnormal discharge. Hereinafter, the gas supply structure of the embodiment will be described with reference to FIGS. 4 and 5D. FIG. 4 shows the configuration of the gas supply structure of the plasma processing apparatus 1 according to the embodiment. FIGS. 5A and 5B are perspective views when the gas nozzles 17 and 16 of FIG. 4 are taken out from the ceiling wall 11.

The protrusion 11a is formed by cutting out the ceiling wall 11 to form substantially a cylindrical shape which protrudes downward from the lower surface of the ceiling wall 11. The protrusion 11a is integrated with the ceiling wall 11 and is made of a conductive material such as aluminum. The surface of the ceiling wall 11 including the protrusion 11a is coated with an yttria ($Y_2O_3$) film so as not to be easily affected by plasma. The leading end of the protrusion 11a is rounded, and there is no corner or gap on the surface of the ceiling wall 11 including the protrusion 11a. Therefore, when the microwave propagates on the surface of the ceiling wall 11 including the protrusion 11a, the concentration of the microwave does not occur, which can avoid the occurrence of an abnormal discharge.

The shape and length of the plurality of protrusions 11a are the same. The gas hole 11b having a length H of 5 mm or more from the leading end of the gas nozzle 16 and a diameter of 3 mm or more is formed at the leading end of the protrusion 11a, and the leading end of the gas hole 11b is an opening 11e which opens into the process space in the process container 2.

The gas nozzle 16 is of a cartridge type and has a structure to be installed in the process container 2. The gas nozzle 16 can be inserted into the recess 11g of the ceiling wall 11 and mounted to the ceiling wall 11, and can be taken out from the ceiling wall 11. The gas flow passage 16a in the gas nozzle 16 is connected to a fine hole 16c on the outlet side of the gas nozzle 16. The diameter of the fine hole 16c is smaller than the diameter of the gas flow passage 16a. The diameter of the gas hole 11b is larger than the diameter of the fine hole 16c on the outlet side of the gas flow passage 16a. Due to the combination of the fine hole 16c and the gas hole 11b, the leading end structure of the gas supply structure has a dimple shape. The diameters of the gas hole 11b and the opening 11e thereof may be, for example, 4 mm, and the diameter of the fine hole 16c may be 1 mm or smaller than 1 mm. The fine hole 16c is likely to clogged since it has a small diameter of about 1 mm. In the gas nozzle 16, a groove 16b for taking-out the gas nozzle 16 is formed on the inner surface of the gas flow passage 16a. By fitting the leading end of a taking-out jig to be described later into the groove 16b and then pulling up the gas nozzle 16 by the taking-out jig, the gas nozzle 16 can be easily replaced with a new one when the fine hole 16c is clogged. Further, by adopting the cartridge type with which the gas nozzle 16 is replaceable, it is possible to rearrange the gas nozzles 16 by measuring the flow rate of each gas nozzle 16 so that the distribution of a gas supplied from the gas nozzle 16 into the process container 2 is even.

The gas nozzle 16 is made of a conductive material such as aluminum. When the gas nozzle 16 is installed in the protrusion 11a provided on the ceiling wall 11 and/or the protrusion provided on the sidewall 12, the length (the dimension of h2 in FIG. 4) of the gas nozzle 16 is longer than the thickness (the dimension of h1 in FIG. 4) of the ceiling wall 11 and/or the sidewall 12. In FIG. 4, the thickness of an O-ring 18 is included in the length of the gas nozzle 16 for the sake of convenience.

On the outer side surface of the gas nozzle 16, four degassing grooves 16e extending in the longitudinal direction are formed at uniform positions in the circumferential direction. Each degassing groove 16e is a groove extending from the outer side surface of the gas nozzle 16 to the leading end surface thereof. The leading end of the degassing groove 16e is referred to as a leading end groove 16e1. Further, as shown in FIGS. 4 and 5B, the four grooves 16e communicate with each other by a groove 16d provided in the circumferential direction on the inlet side of the gas nozzle 16.

Figures 4, 5A:
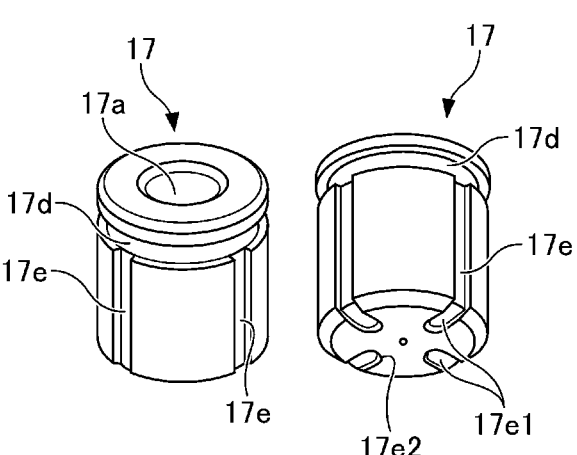
FIG. 4 is a view showing an example of a gas supply structure according to an embodiment.
FIGS. 5A to 5D are perspective views of gas nozzles of FIG. 4.
Figure 5B:
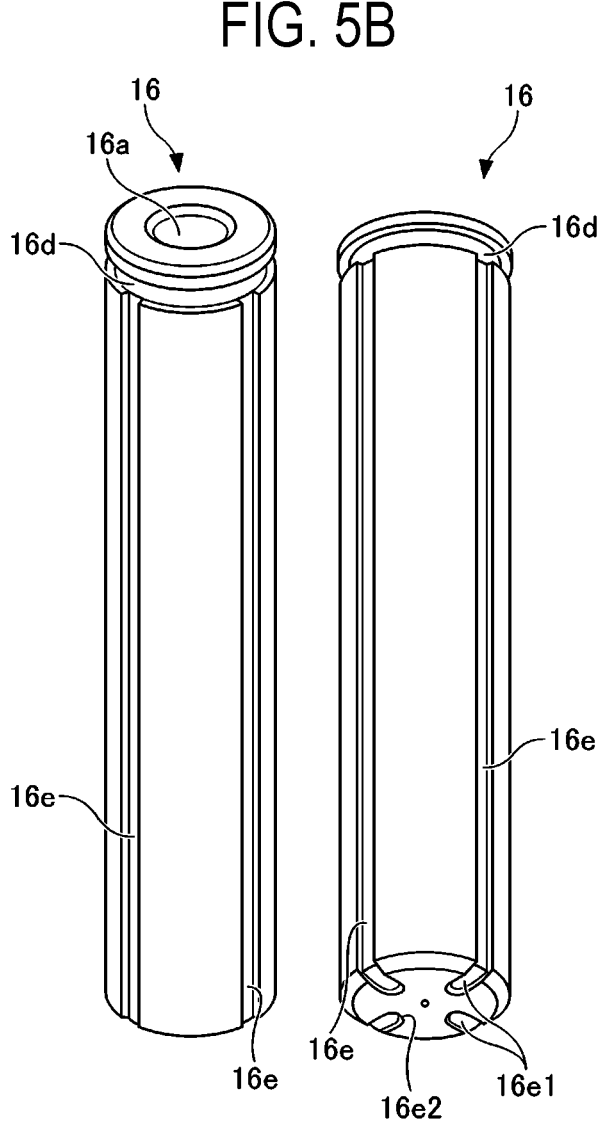
Figure 5C:
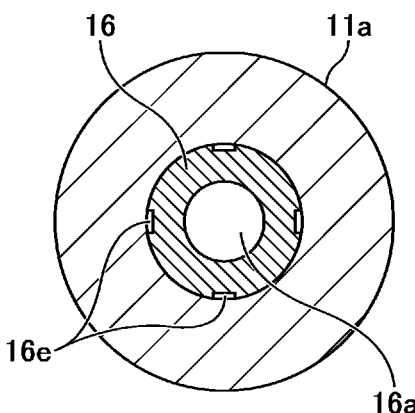

Referring to FIG. 5C showing an A-A cross section of FIG. 4, the degassing grooves 16e are provided at equal intervals in the circumferential direction on the outer side surface of the gas nozzle 16 so that a gas does not stay in a gap between the inner side surface of the protrusion 11*a* and the outer side surface of the gas nozzle 16. That is, the gas nozzle 16 is configured to discharge the gases around the plurality of gas nozzles 16 through the grooves 16*e* while exhausting the interior of the process container 2 by the exhaust device 4.

Figure 5D:
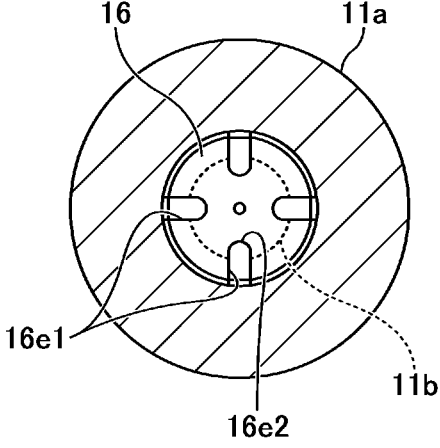

Refer to FIG. 5D showing a B-B cross section of FIG. 4. The degassing groove 16*e* extends from the outer side surface of the gas nozzle 16 to the leading end surface thereof, and the leading end groove 16*e*1 formed on the leading end surface of the gas nozzle 16 is provided so that a gas does not stay in a gap between the bottom surface of the recess 11*g* of the ceiling wall 11 and the leading end surface of the gas nozzle 16. The leading end 16*e*2 of the leading end groove 16*e*1 is located radially inward than the opening of the gas hole 11*b* and communicates with the gas hole 11*b*.

As a result, the exhaust device 4 is configured to discharge a gas in a gap between each of the plurality of gas nozzles 16 and the recess 11*g* in which each gas nozzle 16 is arranged, from the groove 16*e* through the gas hole 11*b* and the leading end groove 16*e*1. This makes it possible to prevent the gas from staying in the gap between the gas nozzle 16 and the ceiling wall 11.

The gas supply structure of the ceiling wall 11 without the protrusion 11*a* will be described with reference to FIGS. 4 and 5D. The ceiling wall 11 has the recess 11*h* for mounting the gas nozzle 17. The gas hole 11*c* having a length of 5 mm or more from the leading end of the gas nozzle 17 and a diameter of 3 mm or more is formed at the leading end of the recess 11*h*, and the leading end of the gas hole 11*c* is of an opening 11*d* which opens into the process container 2.

The gas nozzle 17 is of a cartridge type and has a structure to be installed in the process container 2. The gas nozzle 17 can be inserted into the recess 11*h* of the ceiling wall 11 and installed in the ceiling wall 11, and can be taken out from the ceiling wall 11. The gas flow passage 17*a* in the gas nozzle 17 is connected to a fine hole 17*c* on the outlet side of the gas nozzle 17. The diameter of the fine hole 17*c* is smaller than the diameter of the gas flow passage 17*a*. The diameter of the gas hole 11*c* is larger than the diameter of the fine hole 17*c* on the outlet side of the gas flow passage 17*a*. Due to the combination of the fine hole 17*c* and the gas hole 11*c*, the leading end structure of the gas supply structure has a dimple shape. The diameters of the gas hole 11*c* and the opening 11*d* thereof may be, for example, 4 mm, and the diameter of the fine hole 17*c* may be 1 mm or smaller than 1 mm. The fine hole 17*c* is likely to clogged since it has a small diameter of about 1 mm. In the gas nozzle 17, a groove 17*b* for taking-out the gas nozzle 17 is formed on the inner surface of the gas flow passage 17*a*. By fitting the leading end of a taking-out jig to be described later into the groove 17*b* and then pulling up the gas nozzle 17 by the taking-out jig, the gas nozzle 17 can be easily replaced with a new one when the fine hole 17*c* is clogged.

The gas nozzle 17 is made of a conductive material such as aluminum. When the gas nozzle 17 is installed in the ceiling wall 11 and/or the sidewall 12, the length (the dimension of h3 in FIG. 4) of the gas nozzle 17 is smaller than the thickness (the dimension of h1 in FIG. 4) of the ceiling wall 11 and/or the sidewall 12. In FIG. 4, the thickness of the O-ring 18 is included in the length of the gas nozzle 17 for the sake of convenience.

On the outer side surface of the gas nozzle 17, four degassing grooves 17*e* extending in the longitudinal direction are formed at uniform positions in the circumferential direction. Each degassing groove 17*e* is a groove extending from the outer side surface of the gas nozzle 17 to the leading end surface thereof. The leading end of the degassing groove 17*e* is referred to as a leading end groove 17*e*1. Further, as shown in FIGS. 4 and 5A, the four grooves 17*e* communicate with each other by a groove 17*d* provided in the circumferential direction on the inlet side of the gas nozzle 17.

As a result, the exhaust device 4 is configured to discharge a gas in a gap between each of the plurality of gas nozzles 17 and the recess 11*h* in which each gas nozzle 17 is arranged, from the groove 17*e* through the gas hole 11*c* and the leading end groove 17*e*1. This makes it possible to prevent the gas from staying in the gap between the gas nozzle 17 and the ceiling wall 11.

From the above, the degassing grooves 16*e* and 17*e* can function as an evacuation line to exhaust a gas from the gap between each of the gas nozzles 16 and 17 and the ceiling wall 11 to create a vacuum space. The degassing grooves 16*e* and 17*e* are an example of a first groove for degassing formed on the inner surfaces of the recesses 11*g* and 11*h* and/or the outer surfaces of the plurality of gas nozzles 16 and 17. The number and shape of grooves 16*e* and 17*e* are not limited thereto. In the present disclosure, the degassing grooves 16*e* and 17*e* are formed on the outer surfaces (the outer side surface and the leading end surface) of the plurality of gas nozzles 16 and 17, but the present disclosure is not limited thereto. The degassing grooves 16*e* and 17*e* may be formed on the inner surfaces (the inner side surface and the bottom surface) of the recesses 11*g* and 11*h* or may be formed on both sides thereof.

Further, the grooves 16*b* and 17*b* formed in the circumferential direction on the inner surfaces of the gas flow passages 16*a* and 17*a* on the inlet side of the gas nozzles 16 and 17 are an example of a second groove for taking out the gas nozzles 16 and 17 formed on the inner surfaces of the gas flow passages 16*a* and 17*a* of each of the plurality of gas nozzles 16 and 17.

As shown in FIG. 4, a gas plate 15 is provided on the ceiling wall 11. The O-ring 18 is provided between the upper surface of each of the gas nozzles 16 and 17 and the gas plate 15. The O-ring 18 acts as a seal to prevent a gas flowing from a gas line (not shown) installed in through-holes 15*a* and 15*b* of the gas plate 15 from leaking outside a space between the upper surface of each of the gas nozzles 16 and 17 and the gas plate 15. An O-ring 19 is provided on the outer peripheral side of the O-ring 18 and the gas nozzles 16 and 17 and seals a vacuum region inside the process container 2 from an atmospheric region outside the process container 2.

Figure 6:
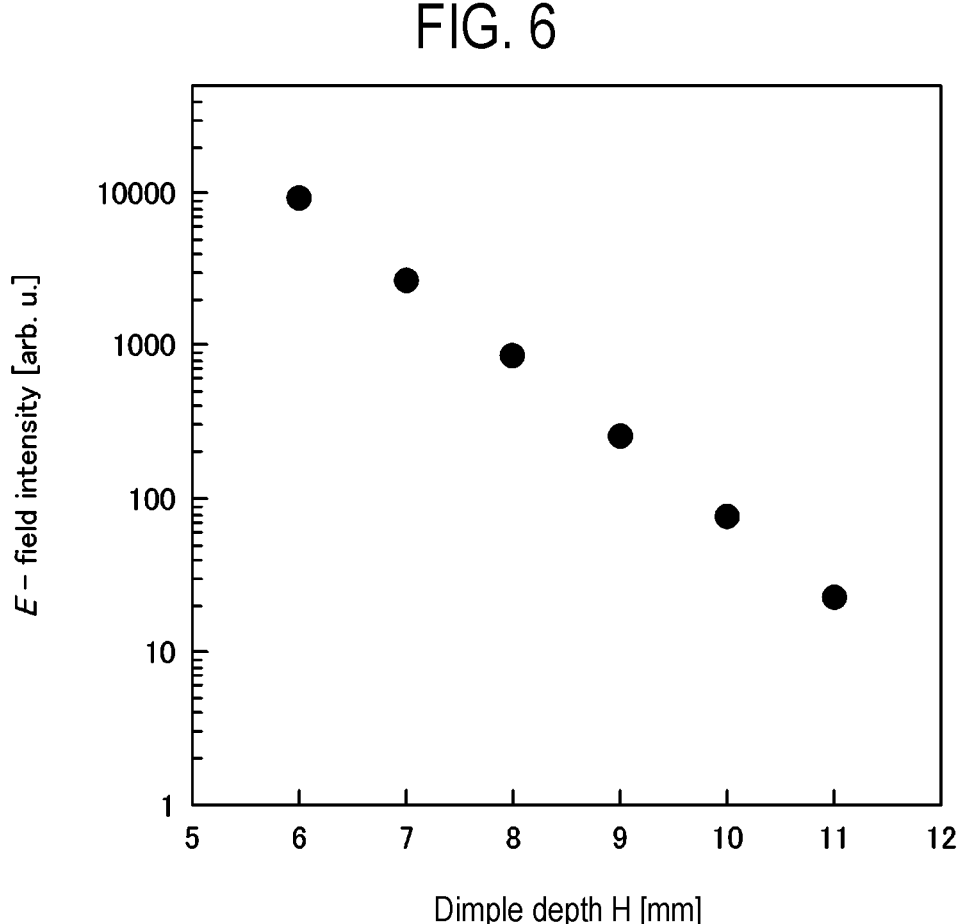
FIG. 6 is a diagram showing the correlation between a dimple depth and an electric field intensity according to an embodiment.

FIG. 6 is a graph showing the correlation between a dimple depth H and an electric field intensity, in which the horizontal axis represents the dimple depth H from the leading end surface (the outlet side) of the gas nozzle 16 or 17 according to the embodiment and the vertical axis represents the electric field intensity. The dimple depth H is an example of a simulation result of analyzing the electric field intensity at the leading end of the gas nozzle 16 when the length H of the gas hole 11*b* shown in FIG. 4 is changed as an example.

As can be seen from the graph, the deeper the dimple depth H, that is, the longer the length of the gas hole 11*b*, the weaker the electric field intensity at the leading end of the gas nozzle 16. The reason for this is considered to be that the longer the length of the gas hole 11*b* is, the more inwardly the adjoining portion between the gas nozzle 16 and the ceiling wall 11 enters the ceiling wall 11 so as to keep the adjoining portion farther from the surface of the protrusion
11a which is a propagation region of the microwave, thereby
resulting in the weakened electric field intensity at the
leading end of the gas nozzle 16.

Therefore, the longer the length of the gas hole 11b (the
deeper the dimple depth H), the more the occurrence of
abnormal discharge can be prevented. However, it has been
confirmed that there is no problem if the length H of the gas
hole 11b is 5 mm or more from the viewpoint of preventing
the abnormal discharge.

The above simulation result can also be used to prevent
the abnormal discharge in the structure of the gas nozzle 17.
That is, since the longer the length of the gas hole 11c is, the
more inwardly the adjoining portion between the gas nozzle
17 and the ceiling wall 11 enters the ceiling wall 11 so as to
keep the adjoining portion farther from the surface of the
ceiling wall 11 which is a propagation region of the micro-
wave, thereby weakening the electric field intensity at the
leading end of the gas nozzle 17. Therefore, the longer the
length of the gas hole 11c (the deeper the dimple depth), the
more the occurrence of abnormal discharge can be pre-
vented. However, it has been confirmed that there is no
problem if the length of the gas hole 11c is 5 mm or more
from the viewpoint of preventing the abnormal discharge.

As described above, according to the plasma processing
apparatus 1 having the gas supply structure of the present
disclosure, a structure (dimple structure) in which the gas
holes 11b and 11c are provided on the ceiling wall 11 on the
outlet side of the gas nozzles 16 and 17 prevents the
microwave from unwantedly going into the gas nozzles 16
and 17. As a result, the occurrence of abnormal discharge
can be prevented by keeping the adjoining portion between
the gas nozzles 16 and 17 and the ceiling wall 11 away from
the surface of the ceiling wall 11 that is a propagation path
of the microwave.

From the above results, in the gas supply structure of the
present disclosure, the gas nozzles 16 and 17 are configured
to have a cartridge type and have a structure to be installed
in the recesses 11g and 11h of the ceiling wall 11. With this
structure, the adjoining portion between each of the gas
nozzles 16 and 17 and the ceiling wall 11 can be kept away
from the microwave propagation region. As a result, not
only when the length of the gas nozzle 16 is long, but also
when the length of the nozzle is short as in the gas nozzle 17,
the dimple structure described above can prevent the occur-
rence of abnormal discharge.

Further, the gas nozzles 16 and 17 have a structure in
which the degassing grooves 16e and 17e are provided at
least on the outer side surfaces of the gas nozzles 16 and 17
and/or on the inner side surfaces of the recesses 11g and 11h
of the ceiling wall 11. As a result, it is possible to prevent a
gas from staying in the gap between the outer side surfaces
of the gas nozzles 16 and 17 and the inner side surfaces of
the recesses 11g and 11h of the ceiling wall 11.

[Taking-Out Jig]

Figure 7:
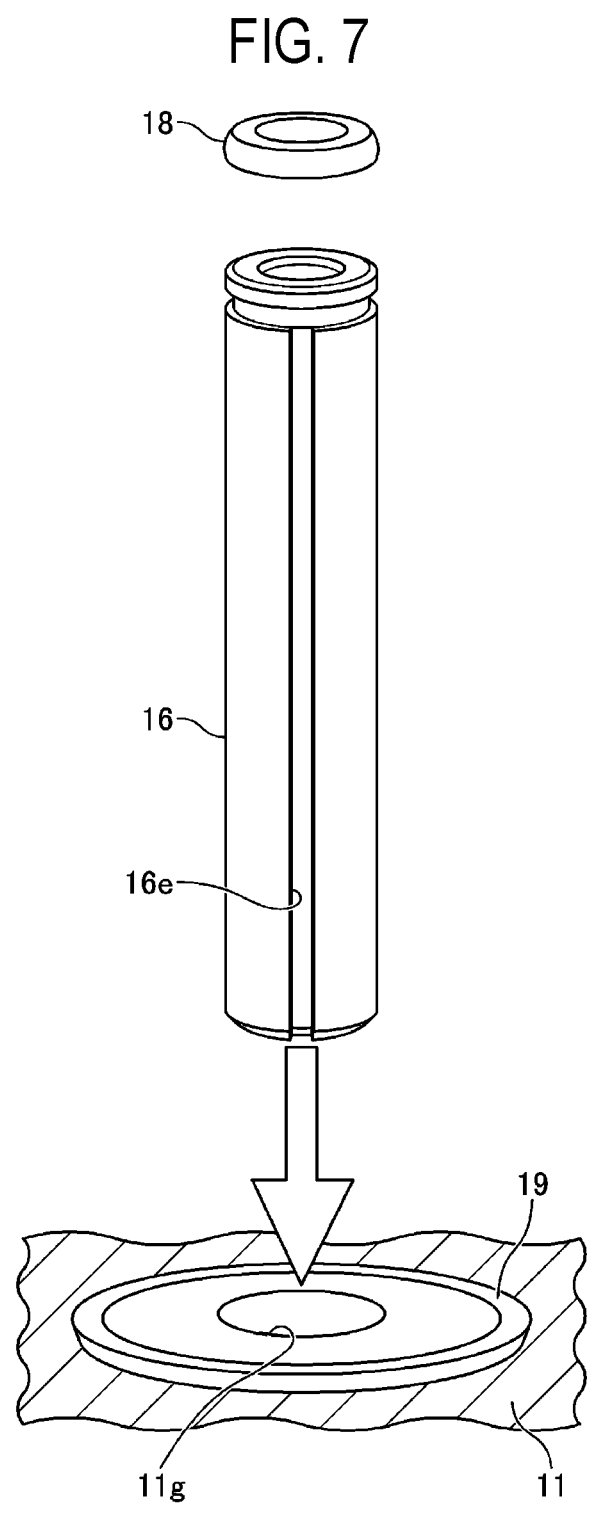

A gas nozzle taking-out jig according to the embodiment
will be described with reference to FIGS. 7 and 8C. FIG. 7
is a view for explaining installation of the gas nozzle
according to the embodiment. FIGS. 8A to 8C are views for
explaining a taking-out jig and a taking-out method of the
gas nozzle according to the embodiment. Here, a method of
taking out the gas nozzle 16 will be described, but the same
applies to a method of taking out the gas nozzle 17.

FIG. 7 shows a state in which the gas nozzle 16 is inserted
from above the ceiling wall 11 and installed into the ceiling
wall 11. As shown in FIG. 7, the gas nozzle 16 is inserted
into the recess 11g provided in the ceiling wall 11. After the insertion, the O-ring 18 is arranged on the upper surface of
the gas nozzle 16. The other gas nozzles 16 are also installed
into the ceiling wall 11 in the same manner. On the upper
surface of the ceiling wall 11, the O-ring 19 is arranged on
the outer periphery of the opening of the recess 11g. After
inserting the gas nozzle 16 into the recess 11g and arranging
the O-ring 18 on the upper surface of the gas nozzle 16, the
gas plate 15 is arranged on the upper portion of the ceiling
wall 11.

A taking-out jig 80 shown in FIGS. 8A to 8C is used to
take out the gas nozzle 16 installed in this way from the
ceiling wall 11. As shown in FIG. 8C, the taking-out jig 80
has a sleeve 81 and a pin 82. FIG. 8A shows only the sleeve
81. The sleeve 81 is made of plastic (resin) and has a
cylindrical shape having a protruding portion at the top. The
sleeve 81 has a hole 81a formed through the center thereof,
and two slits 81b which open toward the lower end thereof
are formed on the side thereof at positions facing each other.
The leading end of the sleeve 81 is thin. FIG. 8B shows the
leading end of the sleeve 81 in an enlarged manner. The
leading end of the sleeve 81 has a reduced cylindrical
portion 81c having a diameter substantially the same as the
diameter of the gas flow passage 16a of the gas nozzle 16.
The hole 81a is formed through the reduced cylindrical
portion 81c. The leading end of the reduced cylindrical
portion 81c has a protrusion 81d which protrudes radially
outward from the reduced cylindrical portion 81c. The shape
of the protrusion 81d has substantially the same shape
(width and height) as the groove 16b provided in the gas
flow passage 16a of the gas nozzle 16. That is, the taking-out
jig 80 is configured such that the reduced cylindrical portion
81c formed at the leading end of the taking-out jig 80 can be
inserted into the gas flow passage 16a and the protrusion 81d
at the leading end of the taking-out jig 80 is fitted into the
groove 16b.

The taking-out method of the gas nozzle 16 using the
taking-out jig 80 is performed in the order of (1) to (4). The
taking-out jig 80 makes it easy to take out the gas nozzle 16
when it is pulled out from the upper portion of the ceiling
wall 11. (1) The side surface of the sleeve 81 is held with the
operator's fingers, so that the two slits 81b on the side
surface of the leading end of the sleeve 81 are closed. (2)
With the slits 81b closed, the sleeve 81 is inserted into the
gas flow passage 16a of the gas nozzle 16 from the leading
end of the sleeve 81. The O-ring 18 may remain placed on
the gas nozzle 16. (3) The pin 82 is inserted into the hole of
the sleeve 81 to prevent the slits 81b from being closed (FIG.
8C). (4) The sleeve 81 is lifted up together with the pin 82
to pull out the gas nozzle 16.

For example, when the plurality of gas nozzles 16 each
having a fine hole 16c with a different diameter is rearranged
in the plurality of recesses 11g of the ceiling wall in order for
a gas to be uniformly supplied into the process container 2
through the plurality of gas nozzles 16, the taking-out jig 80
is suitably used. The taking-out jig 80 can make it easy to
rearrange the gas nozzles 16 such that the flow rate becomes
uniform after measuring the flow rate of a gas supplied from
each gas nozzle 16.

According to the present disclosure in some embodi-
ments, it is possible to provide a plasma processing appa-
ratus having a gas supply structure for avoiding abnormal
discharge.

While certain embodiments have been described, these
embodiments have been presented by way of example only,
and are not intended to limit the scope of the disclosures.
Indeed, the embodiments described herein may be embodied
in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A plasma processing apparatus comprising:
a process container;
a power supply configured to supply radio frequency or microwave power for generating plasma in the process container;
a plurality of gas nozzles, each having a gas flow passage therein; and
a plurality of protrusions formed integrally with a ceiling wall and/or a sidewall that defines the process container, the plurality of protrusions protruding from the ceiling wall and/or the sidewall,
wherein each of the plurality of protrusions has a gas hole at a leading end of the protrusion, and
wherein the ceiling wall and/or the sidewall has recesses in which the plurality of gas nozzles is buried, respectively, and an outlet of each of the plurality of gas nozzles buried in the recess is connected to the gas hole of each of the plurality of protrusions at a position distanced from an outlet of the gas hole of each of the plurality of protrusions, such that the gas flow passage of each of the plurality of gas nozzles communicates with the gas hole of each of the plurality of protrusions.

2. The plasma processing apparatus of claim 1, wherein a length of each of the plurality of gas nozzles is longer than a thickness of the ceiling wall and/or the sidewall in which the plurality of gas nozzles is arranged.

3. The plasma processing apparatus of claim 2, wherein a diameter of the gas hole is larger than a diameter on an outlet side of the gas flow passage communicating with the gas hole.

4. The plasma processing apparatus of claim 3, wherein a length of the gas hole is 5 mm or more.

5. The plasma processing apparatus of claim 4, wherein a first groove for degassing is formed on an inner surface of each of the recesses and/or an outer surface of each of the plurality of gas nozzles.

6. The plasma processing apparatus of claim 5, wherein the first groove has a leading end groove extending from an inner side surface of each of the recesses to a bottom surface of each of the recesses and/or a leading end groove extending from an outer side surface of each of the plurality of gas nozzles to a leading end surface of each of the plurality of gas nozzles.

7. The plasma processing apparatus of claim 6, wherein the leading end groove formed on the leading end surface of each of the plurality of gas nozzles extends to a position radially inward than an opening of the gas hole communicating with each of the plurality of gas nozzles.

8. The plasma processing apparatus of claim 1, wherein a diameter of the gas hole is larger than a diameter on an outlet side of the gas flow passage communicating with the gas hole.

9. The plasma processing apparatus of claim 1, wherein a length of the gas hole is 5 mm or more.

10. The plasma processing apparatus of claim 1, wherein a first groove for degassing is formed on an inner surface of each of the recesses and/or an outer surface of each of the plurality of gas nozzles.

11. The plasma processing apparatus of claim 1, wherein a second groove for taking-out each of the plurality of gas nozzles is formed on an inner surface of the gas flow passage of each of the plurality of gas nozzles.

* * * * *